(12) United States Patent
Kuo et al.

(10) Patent No.: US 7,443,686 B2
(45) Date of Patent: Oct. 28, 2008

(54) ELECTRONIC SYSTEM

(75) Inventors: Robert Kuo, Taipei (TW); James Hsyu, Taipei (TW); Langhans Chang, Taipei (TW); Stanley Huang, Taipei (TW)

(73) Assignee: VIA Technologies, Inc., Taipei (TW)

( * ) Notice: Subject to any disclaimer, the term of this patent is extended or adjusted under 35 U.S.C. 154(b) by 400 days.

(21) Appl. No.: 11/285,014

(22) Filed: Nov. 23, 2005

(65) Prior Publication Data
US 2007/0035931 A1 Feb. 15, 2007

(30) Foreign Application Priority Data
Aug. 15, 2005 (TW) ................ 94127783

(51) Int. Cl.
*H05K 7/20* (2006.01)
(52) U.S. Cl. .............. 361/719; 361/715; 361/720
(58) Field of Classification Search ........ 361/712, 361/713, 719, 715, 720
See application file for complete search history.

(56) References Cited

U.S. PATENT DOCUMENTS

| | | | |
|---|---|---|---|
| 6,075,700 A * | 6/2000 | Houghton et al. .......... 361/704 |
| 6,580,611 B1 * | 6/2003 | Vandentop et al. ........ 361/704 |
| 7,057,895 B2 * | 6/2006 | Mejia et al. ............... 361/700 |
| 7,209,354 B2 * | 4/2007 | Wu et al. ................... 361/697 |
| 2001/0004313 A1 * | 6/2001 | Yamaoka .................. 361/704 |
| 2002/0008963 A1 * | 1/2002 | DiBene et al. ............ 361/720 |
| 2002/0030972 A1 * | 3/2002 | Ali et al. .................. 361/704 |
| 2003/0139071 A1 * | 7/2003 | Li et al. ....................... 439/66 |
| 2004/0264142 A1 * | 12/2004 | Mejia et al. ............... 361/719 |
| 2005/0141199 A1 * | 6/2005 | Chiou et al. .............. 361/704 |
| 2006/0012959 A1 * | 1/2006 | Lee et al. .................. 361/700 |
| 2006/0268524 A1 * | 11/2006 | Uehara et al. ............. 361/715 |
| 2008/0007914 A1 * | 1/2008 | Peng et al. ................ 361/700 |

* cited by examiner

*Primary Examiner*—Jayprakash N Gandhi
*Assistant Examiner*—Anthony M Haughton
(74) *Attorney, Agent, or Firm*—Birch, Stewart, Kolasch & Birch, LLP

(57) ABSTRACT

An electronic system includes a circuit board, a first conducting element, a second conducting element and at least one connecting element. In this case, the circuit board has at least one through hole and at least one grounding unit disposed around the through hole. The first conducting element is disposed on one side of the circuit board, and the second conducting element is disposed on the other side of the circuit board. The connecting element is disposed through the through hole for connecting the first conducting element and the second conducting element.

18 Claims, 5 Drawing Sheets

ELECTRONIC SYSTEM

BACKGROUND OF THE INVENTION

1. Field of Invention

The invention relates to an electronic system, and, in particular, to an electronic system having the heat dissipating function.

2. Related Art

With the progress of the modern technology, various multimedia apparatuses, desktop computers and notebook computers are designed in more compact and having powerful functions. However, as the product performance is getting higher and higher, the number of the used electronic elements is increased. Accordingly, the heat dissipating requirement is getting higher and higher because the heat dissipating effect directly determines the lifetime of each electronic apparatus.

The active heat dissipating system in the early age includes a combination of a fan and a heat sink. Such a combination, however, has low heat dissipation efficiency and high power consumption and occupies a larger space. Thus, the fanless heat dissipating system is gradually developed to replace the combination of the fan and the heat sink.

In the prior art, as shown in FIG. 1, a fanless heat dissipating system 1 is a heat dissipating system without a fan. The system is composed of a heat sink 11, a heat pipe 12 and a metal plate 13, and is disposed on a circuit board 14 to dissipate heat from a chip 15 or other electronic elements. In the fanless heat dissipating system 1, the heat pipe 12 performs a cooling process according to the property of absorbing or dissipating heat during the phase-change procedure. Specifically speaking, the heat pipe 12 is vacuumed and then filled with a liquid, which may be easily evaporated and has an evaporating temperature approximating the environment temperature, and is then sealed. One end of the heat pipe 12 pertains to an evaporating section, and the other end of the heat pipe 12 pertains to a condensing section. When one end of the heat pipe 12 is heated, the liquid evaporates into vapor flowing to the other end under a minor pressure difference. Then, the vapor releases heat and condenses into the liquid, which flows back to the evaporating section according to the capillary property. Thus, a circulating loop is formed to dissipate the heat.

As shown in FIG. 1, when the heat pipe 12 connects with the metal plate 13, the heat pipe 12 cannot be bent by 90 degrees because the heat pipe 12 has the capillary structure. Thus, a larger space is needed for installing the heat dissipating system, and the size of the casing has to be enlarged. Such a design is complicated and costs higher and the size of the product cannot be effectively reduced. If the heat pipe 12 is curved much more to improve the above-mentioned drawback, the heat dissipating effect will be deteriorated.

In addition, if noise is coupled to the heat sink 11 and cannot be eliminated through a proper grounding point, an antenna field tends to be formed to emit an electromagnetic interference (EMI) signal, which does not satisfy the safety specification.

Thus, it is an important subject of the invention to provide an electronic system capable of solving the above-mentioned problems.

SUMMARY OF THE INVENTION

In view of the foregoing, the invention is to provide an electronic system without a curved heat pipe.

In addition, the invention is to provide an electronic system capable of removing EMI signals of a heat sink.

To achieve the above, an electronic system of the invention includes a circuit board, a first conducting element, a second conducting element and at least one connecting element. In this invention, the circuit board has at least one through hole and at least one grounding unit disposed around the through hole. The first conducting element and the second conducting element are respectively disposed on two sides of the circuit board. The connecting element is disposed through the through hole of the circuit board and connects the first conducting element with the second conducting element.

As mentioned hereinabove, the electronic system of the invention utilizes the connecting element to connect the first conducting element with the second conducting element. Thus, the curved heat pipe adopted in the prior art is unnecessary, and the space in the casing is never influenced such that the size and the cost of the electronic system may be reduced. In addition, because the connecting element, the first conducting element, the second conducting element and the heat pipe work in conjunction with one another, either the chips or other electronic elements on the circuit board may be rapidly cooled down through these heat dissipating mechanisms. Furthermore, the invention utilizes the resilient member to make the first conducting element and the second conducting element in contact with the grounding layer, so the electronic system of the invention can provide a larger grounding surface area to enhance the electromagnetic compatibility, easily suppress the EMI signal, and enhance the electromagnetic sensitivity. Thus, the performance and the operation quality of the electronic apparatus may be greatly enhanced, and the lifetime and the usage of the electronic apparatus may also be enhanced.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
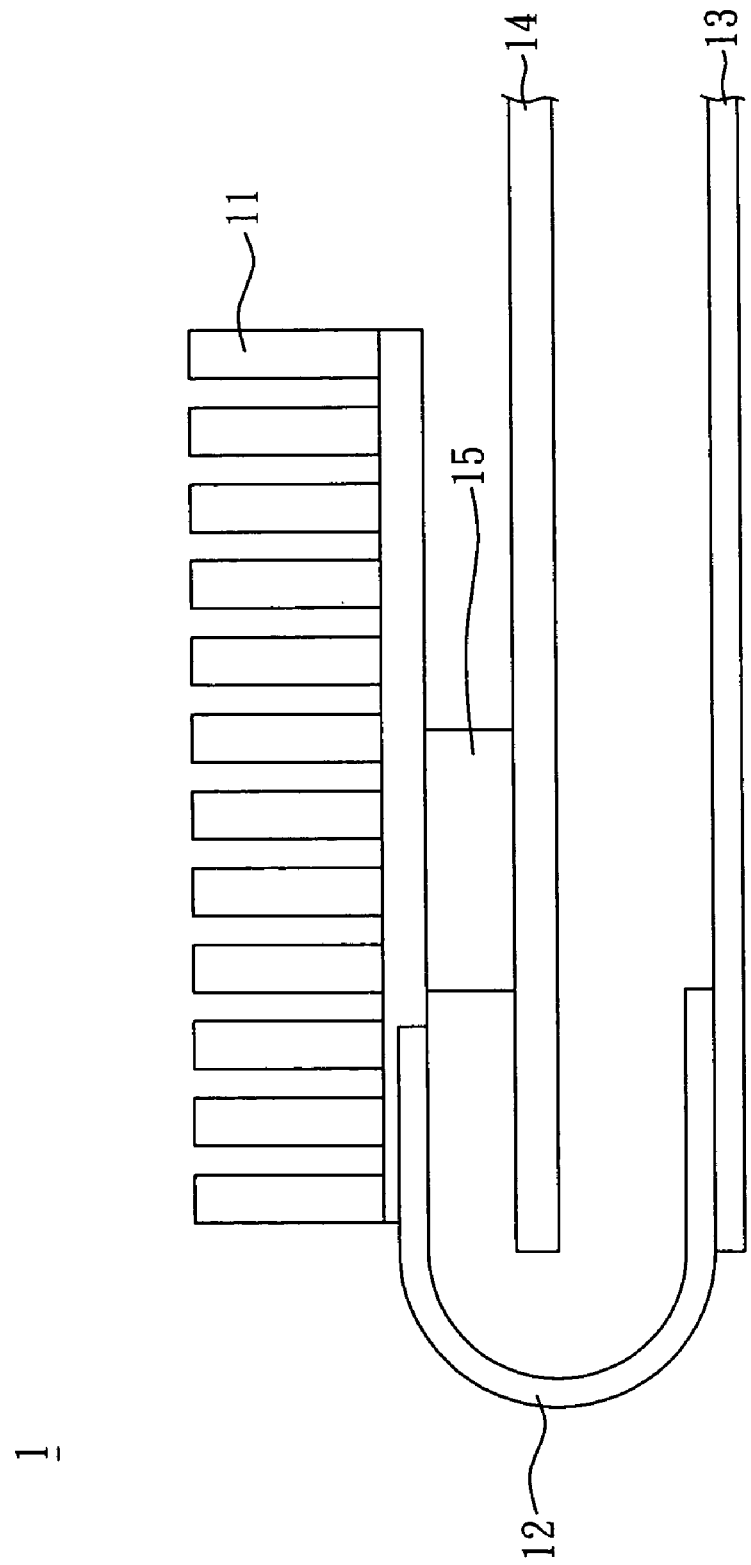
FIG. 1 is a schematic illustration showing a conventional fanless heat dissipating system.
Figure 2:
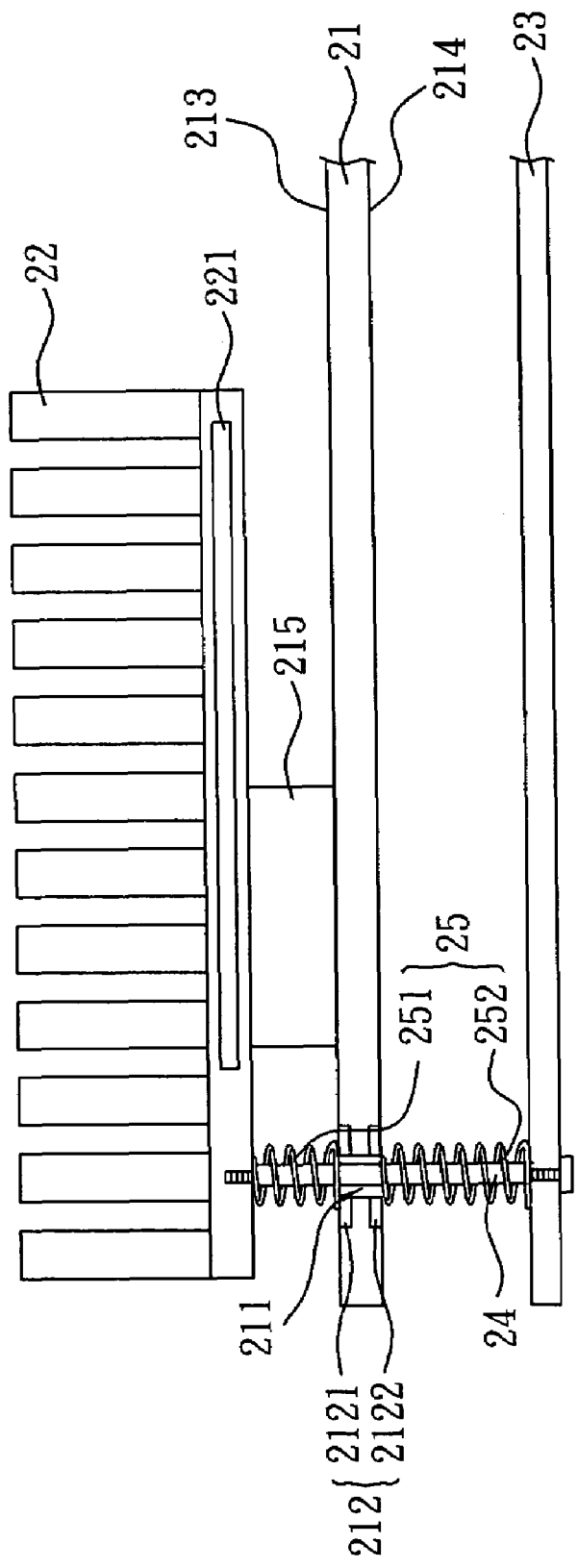
FIG. 2 is a schematic illustration showing an electronic system according to a preferred embodiment of the invention.

Referring to FIG. 2, an electronic system 2 according to a preferred embodiment of the invention includes a circuit board 21, a first conducting element 22, a second conducting element 23 and at least one connecting element 24. The type of the electronic system 2 is not fully restricted. For example, the electronic system 2 may be a fanless electronic system, or a system including at least one fan disposed on the first conducting element 22 or the second conducting element 23. In this embodiment, the fanless electronic system will be described as an example.

Referring again to FIG. 2, in the electronic system 2, the circuit board 21 has at least one through hole 211 and at least one grounding unit 212 disposed around the through hole 211. In this embodiment, the grounding unit 212 has a first grounding portion 2121 and a second grounding portion 2122. The first grounding portion 2121 is disposed on a first surface 213 of the circuit board 21, and the second grounding portion 2122 is disposed on a second surface 214 of the circuit board 21. The grounding unit 212 functions to ground the circuit.

In the electronic system 2 of FIG. 2, the first conducting element 22 and the second conducting element 23 are respectively disposed on two sides of the circuit board 21, and each of the first conducting element 22 and the second conducting element 23 may be an electrical conductor or a thermal conductor.

In the current embodiment, the first conducting element 22 and the second conducting element 23, which may be made of any suitable material such as the metal, are a heat sink and a plate, respectively. Of course, each of the first conducting element 22 and the second conducting element 23 may also be a heat sink or a plate according to the actual requirement. As shown in FIG. 2, the first conducting element 22 further has a heat pipe 221 disposed below the first conducting element 22. The heat pipe 221 is hollow and has a capillary structure, in which a liquid that may easily evaporate is filled. Accordingly, the heat pipe 221 may perform a cooling process using the property of absorbing or dissipating heat during the phase-change procedure of the liquid, such that the electronic system 2 may have the better heat dissipating effect. To be noted, the heat pipe 221 may be disposed on the first conducting element 22 and/or the second conducting element 23.

In this embodiment, the circuit board 21 further includes at least one chip 215. With reference to FIG. 2, the chip 215 is disposed on the first surface 213 of the circuit board 21 and in contact with the first conducting element 22. Such a design is to dissipate heat from the chip 215 rapidly. In addition, the chip (not shown) may also be disposed on the second surface 214 of the circuit board 21 and in contact with the second conducting element 23. In this embodiment, the chip 215 is disposed on the first surface 213.

Figure 3:
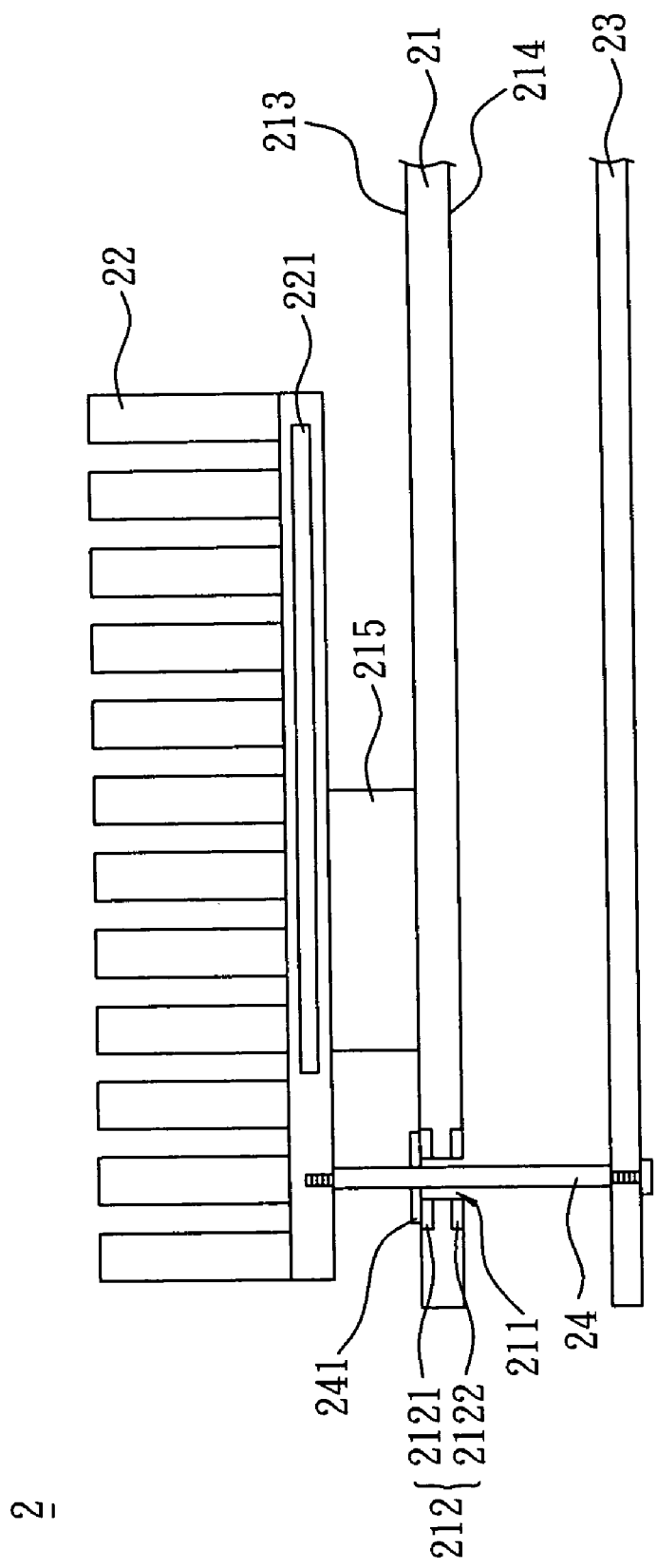
FIG. 3 is a schematic illustration showing an electronic system according to another preferred embodiment of the invention.
Figure 4:
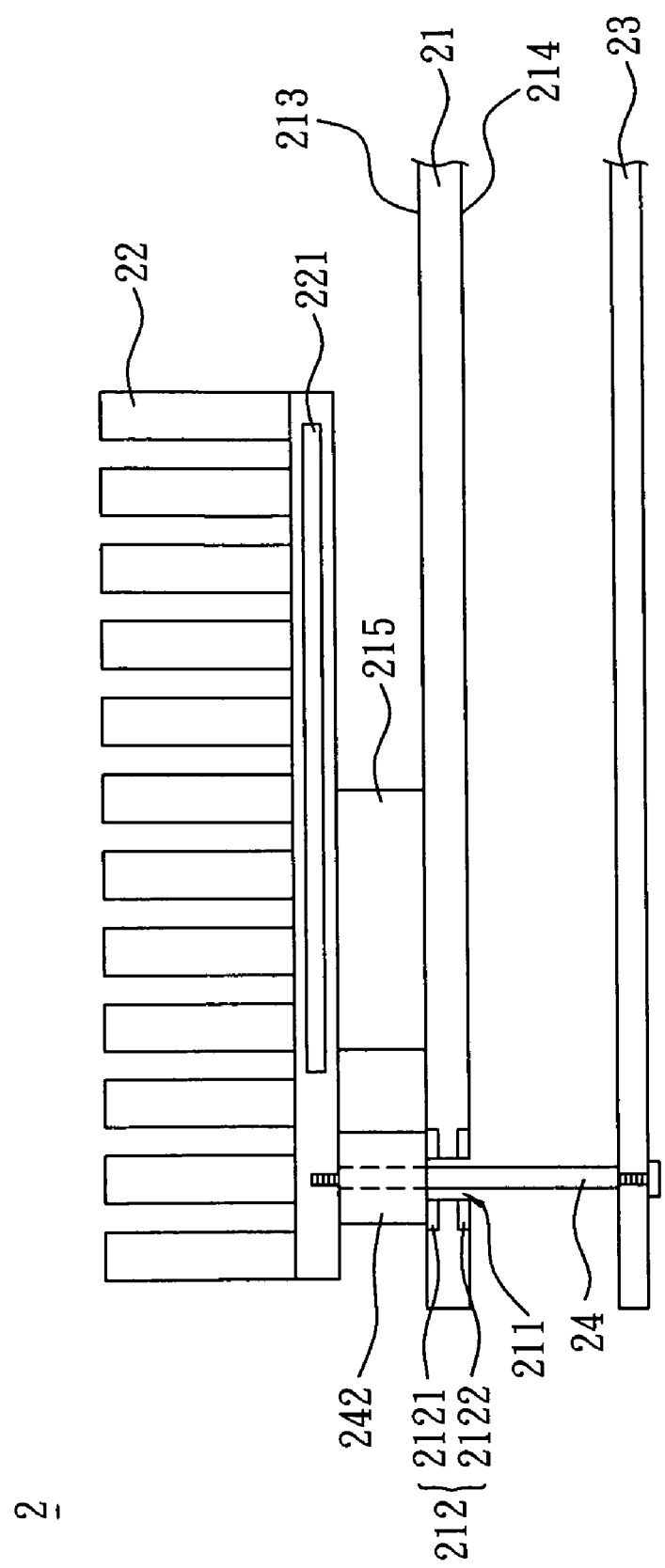
FIG. 4 is a schematic illustration showing an electronic system according to still another preferred embodiment of the invention.

As shown in FIG. 2, the connecting element 24 passes through the through hole 211 of the circuit board 21 and connects the first conducting element 22 with the second conducting element 23 so as to conduct charges or heat between the first conducting element 22 and the second conducting element 23. The connecting element 24 may be made of any suitable material capable of conducting heat and charges. For example, the material of the connecting element 24 may be the copper. Herein, the connecting element 24 is a copper column. In addition, with reference to FIG. 3, the connecting element 24 may have a protruding portion 241 for electrically connecting the grounding unit 212, and the connecting element 24 further electrically connects the first conducting element 22 with the second conducting element 23. For example, the protruding portion 241 in contact with a first grounding unit 2121 or a protruding portion in contact with a second grounding unit (not shown) enables the first conducting element 22 and the second conducting element 23 to conduct charges or heat with the grounding unit 212 through the connecting element 24. The protruding portion 241 may have any suitable shape, such as a ring-shape in this example or a rectangular shape. Referring to FIG. 4, the connecting element 24 may also have a sleeve 242 in contact with the first conducting element 22 and the first grounding unit 2121, or a sleeve in contact with the second conducting element and the second grounding unit (not shown). Thus, the first conducting element 22 and the second conducting element 23 may also conduct charges and heat with the grounding unit 212 through the connecting element 24 and the sleeve 242.

Referring again to FIG. 2, the electronic system 2 further includes at least one resilient member 25, through which the connecting element 24 passes. The resilient member 25 may include a first elastic component 251 and a second elastic component 252. The first elastic component 251 is electrically connected to the first grounding portion 2121 and the first conducting element 22, while the second-elastic component 252 is electrically connected to the second grounding portion 2122 and the second conducting element 23. In this embodiment, the resilient member 25 enables the grounding unit 212 to be electrically connected to the first conducting element 22 and the second conducting element 23 so as to form an powerful grounding system among the three parts, to provide a large grounding surface area for the circuit board 21, and thus to avoid the EMI. The resilient member 25 may have any suitable type, such as an elastic sheet or a spring. Because the electronic system 2 of this embodiment can provide the large grounding surface area, the electromagnetic energy does not interfere with other apparatuses and is free from being interfered or induced with other electromagnetic energies of other apparatuses. Thus, the electromagnetic compatibility is enhanced, and the EMI signal may also be easily suppressed. Moreover, because the EMI is reduced, the electromagnetic sensitivity may be greatly enhanced.

Figure 5:
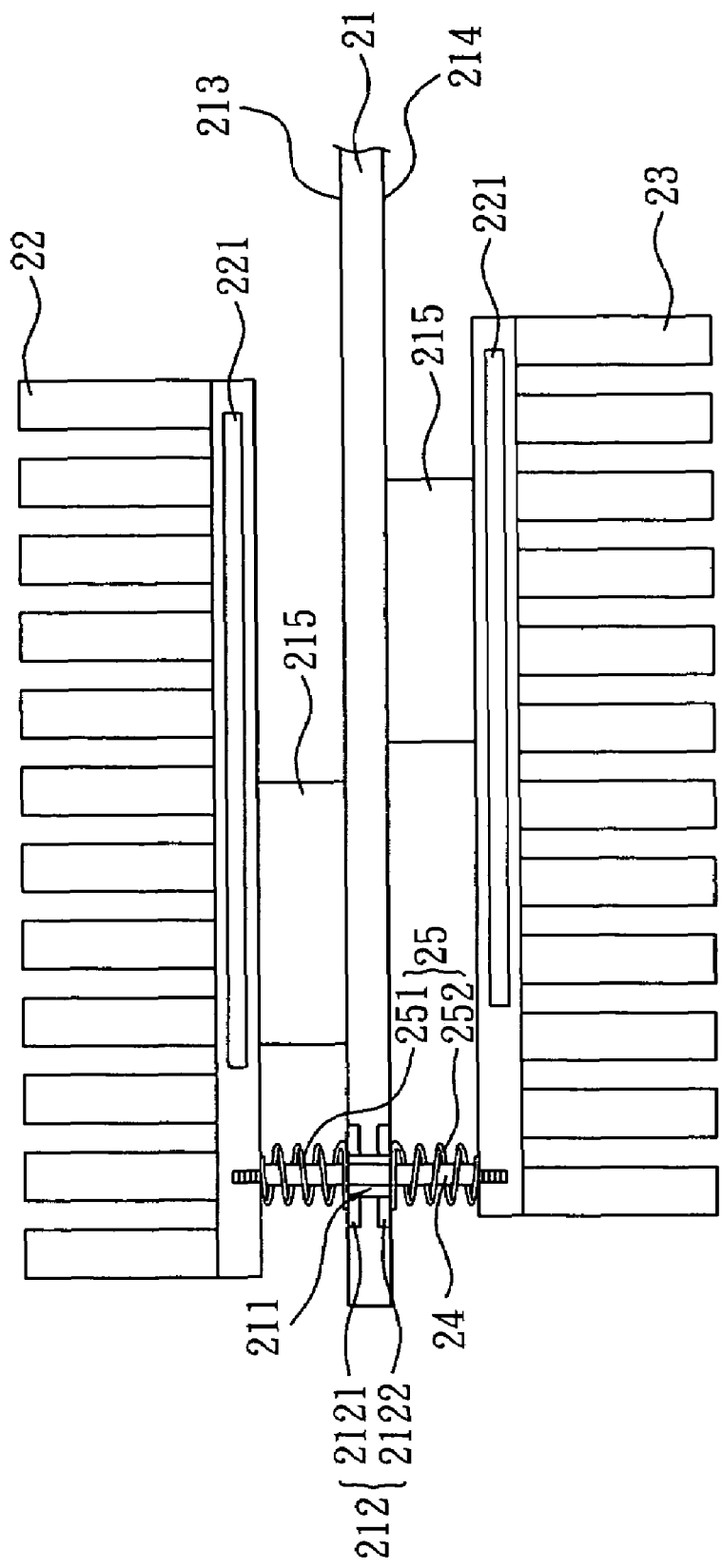
FIG. 5 is a schematic illustration showing an electronic system according to yet still another preferred embodiment of the invention.

As mentioned hereinabove, a plurality of chips may be disposed on the circuit board in the electronic system of the invention, and the first and second conducting elements may respectively be a heat sink or a plate. In order to make the content of the invention clearer, another embodiment will be described in the following. Referring to FIG. 5, an electronic system 3 according to another preferred embodiment of the invention includes a circuit board 21, a first conducting element 22, a second conducting element 23 and at least one connecting element 24. The circuit board 21 has a plurality of chips 215 disposed on a first surface 213 and a second surface 214 of the circuit board 21. In addition, the first conducting element 22 and the second conducting element 23 are heat sinks and respectively have a heat pipe 221 and a heat pipe 231. In this case, other elements of the electronic system 3 are the same as those of the electronic system 2, and the detailed descriptions thereof will be omitted for concise purpose. To be noted, the electronic system of the invention may have various variations and is not restricted by the above-mentioned embodiments.

In summary, the electronic system of the invention utilizes the connecting element to connect the first conducting element with the second conducting element. Thus, the curved heat pipe adopted in the prior art is unnecessary, and the space in the casing is never influenced such that the size and the cost of the electronic system may be reduced. In addition, because the connecting element, the first conducting element, the second conducting element and the heat pipe work in conjunction with one another, either the chips or other electronic elements on the circuit board may be rapidly cooled down through these heat dissipating mechanisms. Furthermore, the invention utilizes the resilient member to make the first conducting element and the second conducting element in contact with the grounding layer, so the electronic system of the invention can provide a larger grounding surface area to enhance the electromagnetic compatibility, easily suppress the EMI signal, and enhance the electromagnetic sensitivity. Thus, the performance and the operation quality of the electronic apparatus may be greatly enhanced, and the lifetime and the usage of the electronic apparatus may also be enhanced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. An electronic system, comprising:
a circuit board having at least one through hole and at least one grounding unit disposed around the through hole;
a first conducting element disposed on one side of the circuit board;
a second conducting element disposed on the other side of the circuit board; and
at least one connecting element passing through the through hole and connecting a surface of the first conducting element to a surface of the second conducting element, wherein the surface of the first conducting element and the surface of the second conducting element both face the circuit board, at least one resilient member electrically connecting the grounding unit with the first conducting element and the second conducting element, wherein the connecting element passes through the resilient member, wherein the grounding unit comprises a first grounding portion and a second grounding portion, and the resilient member comprises a first elastic component electrically connecting the first grounding portion with the first conducting element, and a second elastic component electrically connecting the second grounding portion with the second conducting element.

2. The electronic system according to claim 1, wherein the grounding unit has a first grounding portion disposed on a first surface of the circuit board, and a second grounding portion disposed on a second surface of the circuit board.

3. The electronic system according to claim 1, wherein the first conducting element and the second conducting element are electrical conductors, and the connecting element conducts charges between the first conducting element and the second conducting element.

4. The electronic system according to claim 1, wherein the first conducting element and the second conducting element are thermal conductors, and the connecting element conducts heat between the first conducting element and the second conducting element.

5. The electronic system according to claim 1, wherein the circuit board further comprises: at least one chip disposed on a first surface of the circuit board and in contact with the first conducting element.

6. The electronic system according to claim 5, wherein the first conducting element is a heat sink and has a heat pipe.

7. The electronic system according to claim 1, wherein the circuit board further comprises: at least one chip disposed on a second surface of the circuit board and in contact with the second conducting element.

8. The electronic system according to claim 7, wherein the second conducting element is a heat sink and has a heat pipe.

9. The electronic system according to claim 1, wherein each of the first conducting element and the second conducting element is a heat sink or a plate.

10. The electronic system according to claim 1, wherein the connecting element is a copper column.

11. The electronic system according to claim 1, wherein the resilient member is an elastic sheet or a spring.

12. An electronic system, comprising:
a circuit board having at least one through hole and at least one grounding unit disposed around the through hole;
at least one chip disposed on the circuit board and electrically connecting to the circuit board;
a first conducting element disposed on one side of the circuit board;
a second conducting element disposed on the other side of the circuit board; and
at least one connecting element passing through the through hole, connecting a surface of the first conducting element with a surface of the second conducting element, and electrically connecting to the grounding unit, wherein the surface of the first conducting element and the surface of the second conducting element both face the circuit board, at least one resilient member electrically connecting the grounding unit with the first conducting element and the second conducting element, wherein the connecting element passes through the resilient member, wherein the grounding unit comprises a first grounding portion and a second grounding portion, and the resilient member comprises a first elastic component electrically connecting the first grounding portion with the first conducting element, and a section elastic component electrically connecting the second grounding portion with the second conducting element.

13. The electronic system according to claim 12, wherein the grounding unit has a first grounding portion disposed on a first surface of the circuit board, and a second grounding portion disposed on a second surface of the circuit board.

14. The electronic system according to claim 1, wherein the first conducting element and the second conducting element are electrical conductors and thermal conductors, and the connecting element conducts charges and heat between the first conducting element and the second conducting element.

15. The electronic system according to claim 12, wherein the connecting element has a protruding portion electrically connecting to the grounding unit.

16. The electronic system according to claim 15, wherein the protruding portion is rectangular or ring-shaped.

17. The electronic system according to claim 12, wherein the circuit board has a first grounding unit and a second ground unit, and the connecting element has a sleeve electrically connecting the first conducting element with the first grounding unit and/or electrically connecting the second conducting element with the second grounding unit.

18. The electronic system according to claim 12, wherein the connecting element is a copper column.

* * * * *